(12) United States Patent
Jang

(10) Patent No.: US 8,035,143 B2
(45) Date of Patent: Oct. 11, 2011

(54) SEMICONDUCTOR DEVICE AND METHOD FOR MANUFACTURING THE SAME

(75) Inventor: Hoon Jang, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 24 days.

(21) Appl. No.: 12/610,518

(22) Filed: Nov. 2, 2009

(65) Prior Publication Data
US 2010/0109113 A1 May 6, 2010

(30) Foreign Application Priority Data
Nov. 5, 2008 (KR) .................. 10-2008-0109560

(51) Int. Cl.
*H01L 31/062* (2006.01)

(52) U.S. Cl. ........ 257/292; 257/294; 257/432; 257/459; 257/466; 257/621; 257/E31.113; 257/E21.575; 438/69; 438/98

(58) Field of Classification Search .................. 257/292, 257/294, 432, 459, 466, 621, E31.113, E21.575; 438/69, 98
See application file for complete search history.

(56) References Cited

U.S. PATENT DOCUMENTS

| 2003/0081069 A1* | 5/2003 | Kim et al. ......................... 347/56 |
| 2005/0029643 A1* | 2/2005 | Koyanagi ....................... 257/680 |
| 2008/0111169 A1* | 5/2008 | Liu et al. ........................ 257/292 |
| 2008/0308893 A1* | 12/2008 | Kirby et al. .................... 257/459 |

FOREIGN PATENT DOCUMENTS

| JP | 2005-150463 A | 6/2005 |
| JP | 2006-032497 A | 2/2006 |

* cited by examiner

*Primary Examiner* — Tu-Tu Ho
(74) *Attorney, Agent, or Firm* — Saliwanchik, Lloyd & Eisenschenk

(57) ABSTRACT

Disclosed are an image sensor and a method for manufacturing the same. The image sensor includes a semiconductor substrate formed on a first surface thereof with a readout circuitry and a photodiode area; a metal interconnection layer formed on the first surface; a connection via metal extending from the first surface to a second surface of the semiconductor substrate, the connection via metal having a projection part projecting from the second surface; an insulating layer formed on the first surface of the semiconductor substrate to expose the projection part while surrounding a portion of a lateral side of the projection part; and a metal pad formed on the insulating layer such that the metal pad covers the projection part, thereby shortening an optical path to reduce light loss and improve image sensitivity.

7 Claims, 7 Drawing Sheets

SEMICONDUCTOR DEVICE AND METHOD FOR MANUFACTURING THE SAME

CROSS-REFERENCE TO RELATED APPLICATION

This application claims the benefit under 35 U.S.C. §119 of Korean Patent Application No. 10-2008-0109560, filed Nov. 5, 2008, which is hereby incorporated by reference in its entirety.

BACKGROUND

Generally, image sensors are semiconductor devices used to convert an optical image into an electric signal. The image sensors are typically classified into a charge coupled device (CCD) image sensor, which includes metal-oxide-semiconductor (MOS) capacitors closely adjacent to each other to store charge carriers therein and transfer the charge carriers; and a complementary MOS (CMOS) image sensor, which employs a switching mode to sequentially detect an output of each unit pixel by MOS transistors, in which the MOS transistors are formed on a semiconductor substrate corresponding to the unit pixels through a CMOS technology using peripheral devices, such as a controller and a signal processor.

The CMOS image sensor often includes a color filter formed over a pixel array to selectively supply light having a specific wavelength to a photodiode, thereby reproducing an image. The photodiode may be formed by performing an ion implantation process in a semiconductor substrate.

The CMOS image sensor according to the related art includes a transistor and a photodiode formed on one surface of a semiconductor substrate, and includes a metal interconnection formed over the photodiode and the transistor. However, the area of a light receiving part is restricted due to the routing of the metal interconnection. Light incident onto the light receiving part must pass through a multi-layer interlayer dielectric layer for the metal interconnection such that the light can be supplied to the photodiode. Accordingly, light loss occurs, so that the image sensitivity of the image sensor according to the related art may be degraded.

Further, since the number of metal interconnection layers is restricted in order to shorten an optical path from a microlens to a photodiode, design of the image sensor is restricted.

BRIEF SUMMARY

An embodiment provides an image sensor capable of receiving light through a backside of a semiconductor substrate, which is formed with a metal interconnection layer on a frontside thereof, such that the light can be incident onto a photodiode.

An embodiment provides an image sensor and a method for manufacturing the same, in which a metal pad can be formed on a backside of a semiconductor substrate through a super via such that the metal pad is electrically connected with a via metal of the super via while being electrically insulated from the semiconductor substrate.

An embodiment provides an image sensor and a method for manufacturing the same, in which a metal pad can be formed through a damascene scheme such that the metal pad makes contact with a via metal projecting from a backside of a semiconductor substrate.

An embodiment provides an image sensor and a method for manufacturing the same, in which a metal pad can be formed by projecting a portion of a via metal from a backside of a semiconductor substrate and forming an insulating layer around the projection part such that the metal pad is electrically connected to the via metal while being insulated from the semiconductor substrate.

According to one embodiment, an image sensor includes a semiconductor substrate formed on a first surface thereof with a readout circuitry and a photodiode area; a metal interconnection layer formed on the first surface; a connection via metal extending from the first surface to a second surface of the semiconductor substrate, the connection via metal having a projection part projecting from the second surface; an insulating layer formed on the second surface of the semiconductor substrate to expose the projection part while surrounding a portion of a lateral side of the projection part; and a metal pad formed on the insulating layer such that the metal pad covers the projection part.

According to another embodiment, an image sensor includes a semiconductor substrate formed on a first surface thereof with a readout circuitry and a photodiode area; a metal interconnection layer formed on the first surface; a connection via metal extending from the first surface to a second surface of the semiconductor substrate, the connection via metal having a projection part projecting from the second surface; a protective layer formed on the second surface and having a trench to expose the projection part; and a metal pad formed in the trench so that the metal pad is electrically connected to the projection part and insulated from the semiconductor substrate.

According to one embodiment, a method for manufacturing an image sensor includes forming a readout circuitry and a photodiode area on a first surface of a semiconductor substrate; forming a connection via by etching the semiconductor substrate; forming a connection via metal in the connection via; forming a metal interconnection layer on the first surface such that the metal interconnection layer is electrically connected with the readout circuitry and the connection via metal; forming a projection part by projecting a portion of the connection via metal through a grinding process of a second surface of the semiconductor substrate; forming an oxide layer, which exposes the projection part, on the second surface; and forming a metal pad covering the projection part.

According to another embodiment, a method for manufacturing an image sensor includes forming a readout circuitry and a photodiode area on a first surface of a semiconductor substrate; forming a connection via by etching the semiconductor substrate; forming a connection via metal in the connection via; forming a metal interconnection layer on the first surface such that the metal interconnection layer is electrically connected with the readout circuitry and the connection via metal; forming a projection part by projecting a portion of the connection via metal through a grinding process of a second surface of the semiconductor substrate; forming a protective layer, which covers the projection part, on the second surface; forming a trench, which exposes the projection part, on the protective layer; and forming a metal pad by filling metal in the trench.

DETAILED DESCRIPTION

Figure 1:
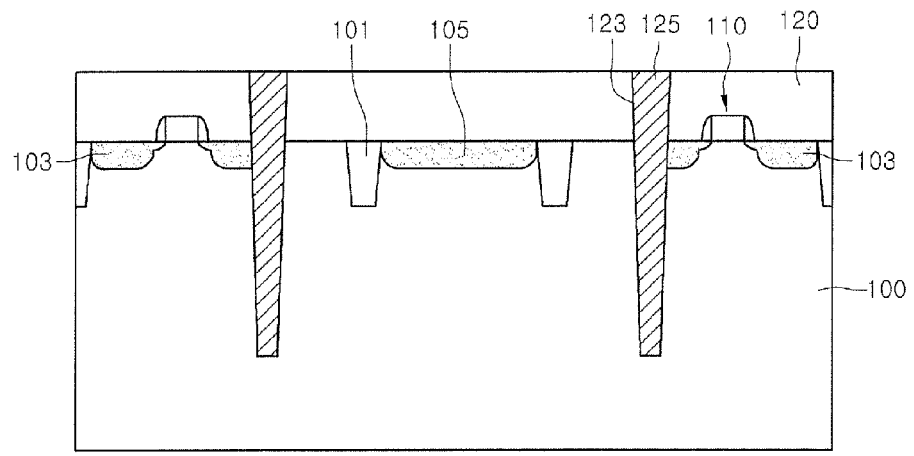
FIGS. 1 to 9 are cross-sectional views showing a method for manufacturing an image sensor according to an embodiment.

Hereinafter, embodiments of an image sensor and a method for manufacturing the same will be described in detail with reference to accompanying drawings.

In the description of embodiments, it will be understood that when a layer (or film) is referred to as being 'on/over' another layer or substrate, it can be directly on/over another layer, or intervening layers may also be present.

The thickness and size of layers shown in the drawings may be simplified or exaggerated for the purpose of convenience or clarity. In addition, the size of each element may be reduced or magnified from the real size thereof.

FIGS. 1 to 9 are cross-sectional views showing a method for manufacturing an image sensor according to an embodiment.

A semiconductor substrate may include a wafer having a single crystalline structure, or a silicon substrate in which an epitaxial layer is formed on a wafer.

As shown in FIG. 1, a readout circuitry may be formed on a semiconductor substrate 100.

The readout circuit may include a plurality of transistors 110.

The transistors may include a transfer transistor, a reset transistor, a drive transistor, and a select transistor.

The readout circuitry may include a floating diffusion area formed by implanting impurity ions into the semiconductor substrate 100 and an active area including a source/drain area 103 for each transistor.

A photodiode area 105 is formed by implanting impurity ions into the active area defined in the semiconductor substrate 100 corresponding to a pixel area. The photodiode area 105 may be formed by implanting N-type impurities into a specific area corresponding to each pixel using an ion implant process and a photolithography process.

The active area may be defined by an isolation layer pattern 101. The isolation layer pattern 101 can be formed by filling an insulating material in a trench of the semiconductor substrate 100.

An insulating layer 120 is formed on the semiconductor substrate 100 including the transistors 110. The insulating layer 120 may be a pre-metal dielectric layer. The insulating layer 120 may include a single layer or a plurality of stacked layers.

At least one connection via 123 is formed in the insulating layer 120 and the semiconductor substrate 100 such that the connection via 123 can be connected with a metal interconnection.

The connection via 123 may be formed at a depth of 500 μm to 700 μm from a top surface of the insulating layer 120. The connection via 123 may have a width of 1 μm to 10 μm.

Preferably, the connection via 123 may have a depth of 10 μm to 100 μm.

The connection via 123 may be formed through a reactive ion etching scheme.

A connection via metal 125 is formed in the connection via 123. The connection via metal 125 electrically connects the transistors 110 with a metal pad to be formed in a subsequent process.

Figure 2:
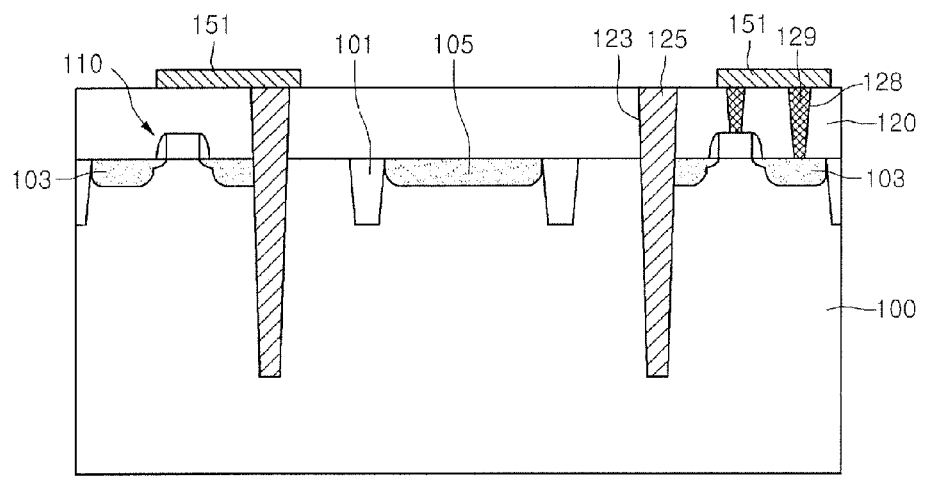

As shown in FIG. 2, a via 128 and a via metal 129 connected to a transistor 110 can be formed in the insulating layer 120.

The via 128 and the via metal 129 have a depth within the thickness of the insulating layer 120.

The via 128 and the via metal 129 may be connected with a first metal interconnection 151 on the insulating layer 120.

A plurality of first metal interconnections 151 are formed on the insulating layer 120.

The first metal interconnections 151 may be electrically connected with at least one of the connection via metal 125, the via metal 129, and the active area.

The connection via metal 125 and the via metal 129 may include at least one selected from the group consisting of tungsten (W), copper (Cu), aluminum (Al), and silver (Ag). The connection via metal 125 and the via metal 129 may be deposited through a chemical vapor deposition (CVD), a physical vapor deposition (PVD), or an electro copper plating (ECP).

Titanium (Ti)-based materials or tantalum (Ta)-based materials may be used for a diffusion barrier of the connection via metal 125 and the via metal 129. For example, the diffusion barrier may include at least one of Ti, titanium nitride (TiN), Ta, tantalum nitride (TaN), titanium silicon nitride (TiSiN), and tungsten nitride (WN).

If the connection via metal 125 includes metal different from that of the via metal 129, the connection via 123 and the via 128 are not formed through one process, but different processes.

If the connection via metal 125 and the via metal 129 include the same metal, the connection via 123 and the via 128 may be simultaneously formed through one process. In this case, since the connection via 123 and the via 128 have different depths, an etch stop layer may be employed.

The first metal interconnections 151 may include a capacitor electrode.

Figure 3:
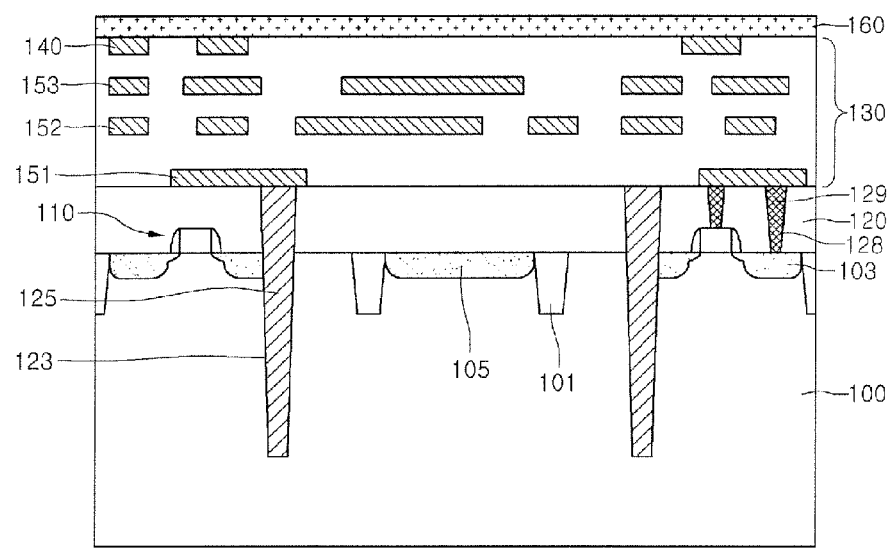

As shown in FIG. 3, a metal interconnection layer 130 is formed on the insulating layer 120 including the first metal interconnections 151. The metal interconnection layer 130 can include a stacked structure of second and third metal interconnections 152 and 153 and a plurality of interlayer dielectric layers.

A protective layer 160 is formed on the entire surface of the metal interconnection layer 130 such that the protective layer 160 covers the entire surface of the metal interconnection layer 130.

The second and third metal interconnections 152 and 153 of the metal interconnection layer 130 may be electrically connected with the first metal interconnections 151.

The second and third metal interconnections 152 and 153 and the first metal interconnections 151 may be formed in regions corresponding to the photodiode area 105. This is because the image sensor according to the embodiments of the present invention receives light through a backside of the semiconductor substrate 100. Accordingly, a metal routing design of the metal interconnection layer 130 can be easily made, and the metal interconnection layer 130 can be variously designed.

The protective layer 160 may include at least one of a nitride layer, an oxide layer, and an oxynitride layer.

The protective layer 160 protects a device when the backside of the semiconductor substrate 100 is ground in the following process.

Figure 4:
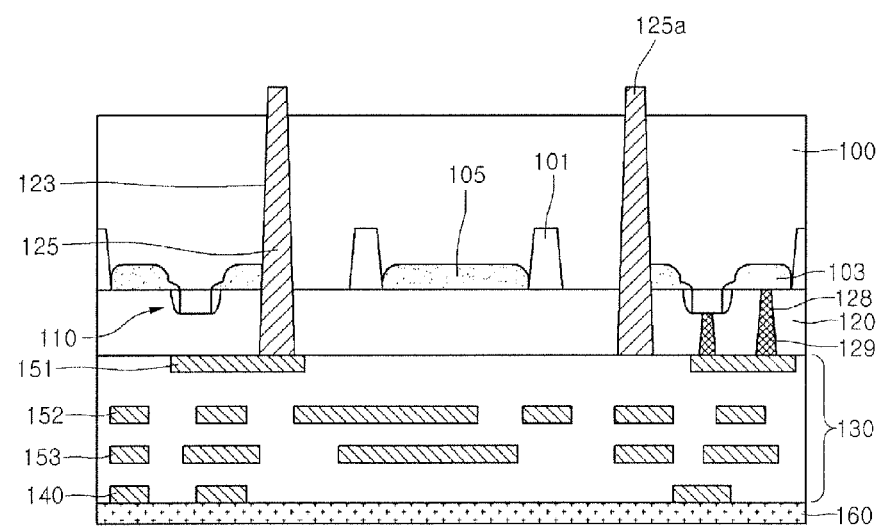

As shown in FIG. 4, the backside of the semiconductor substrate 100 is removed by a predetermined thickness through a back grinding process to expose the connection via metal 125.

The backside of the semiconductor substrate 100 can be etched through a dry etch process such that an end of the connection via metal 125 forms a projection part 125a having a predetermined height from the backside.

The projection part 125a inhibits the connection failure of the metal pad (which is formed in the following process) and the connection via metal 125. In other words, the projection part 125a firmly maintains the electric connection of the metal pad and the connection via metal 125.

An insulating unit is formed to isolate the metal pad from the semiconductor substrate 100, such that the metal pad can be connected with only the connection via metal 125. The insulating unit can be formed by using the projection part 125a.

Figure 5:
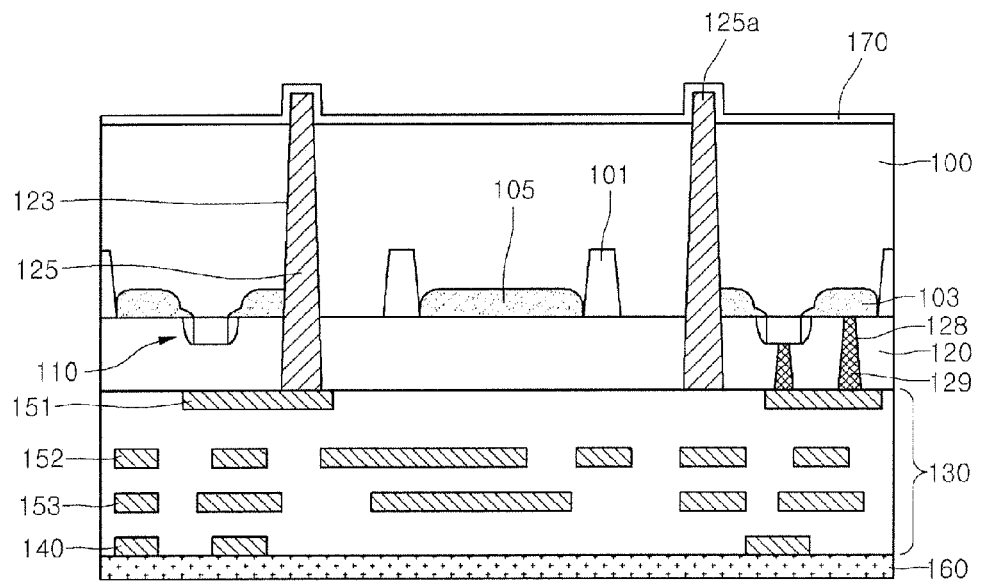

As shown in FIG. 5, a liner oxide layer 170 is formed on the backside of the semiconductor substrate 100.

The liner oxide layer 170 can have a thickness of 500 Å to 2000 Å. The liner oxide layer 170 has a thickness thinner than that of the projection part 125a, such that the profile of the liner oxide layer 170 is formed along the projection part 125a.

The liner oxide layer 170 may be a TEOS layer.

Figure 6:
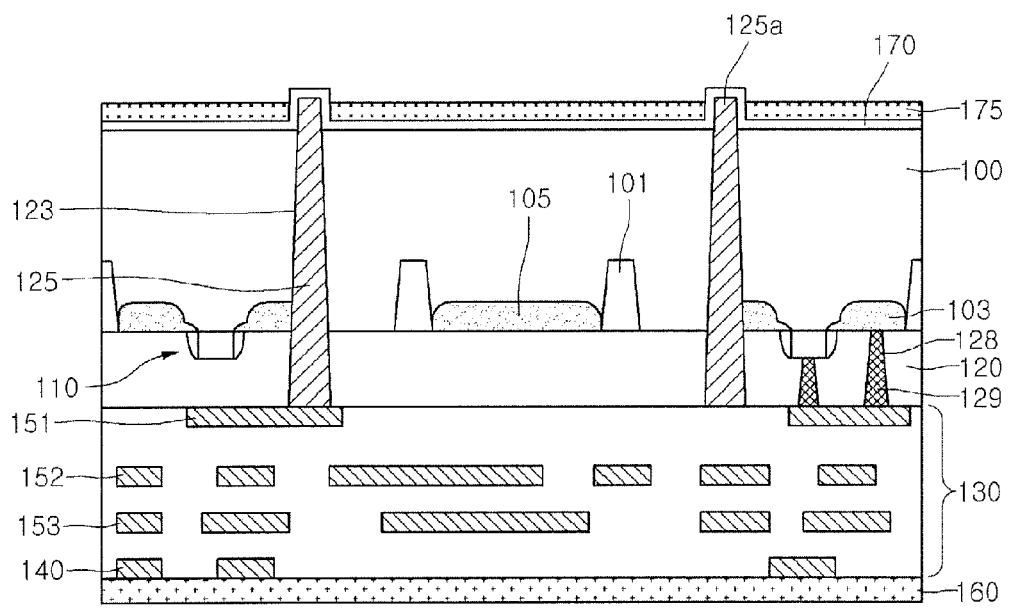

As shown in FIG. 6, photoresist is coated on the liner oxide layer 170, and then subject to a reflow process such that the liner oxide layer 170 corresponding to the projection part 125a can be exposed.

The photoresist 175 is formed at a thickness thinner than the projection height of the projection part 125a such that the photoresist 175 can flow down from the projection part 125a through the reflow process. Accordingly, the projection part 125 can be smoothly exposed.

Thereafter, the photoresist 175 is cured through a bake process.

Figure 7:
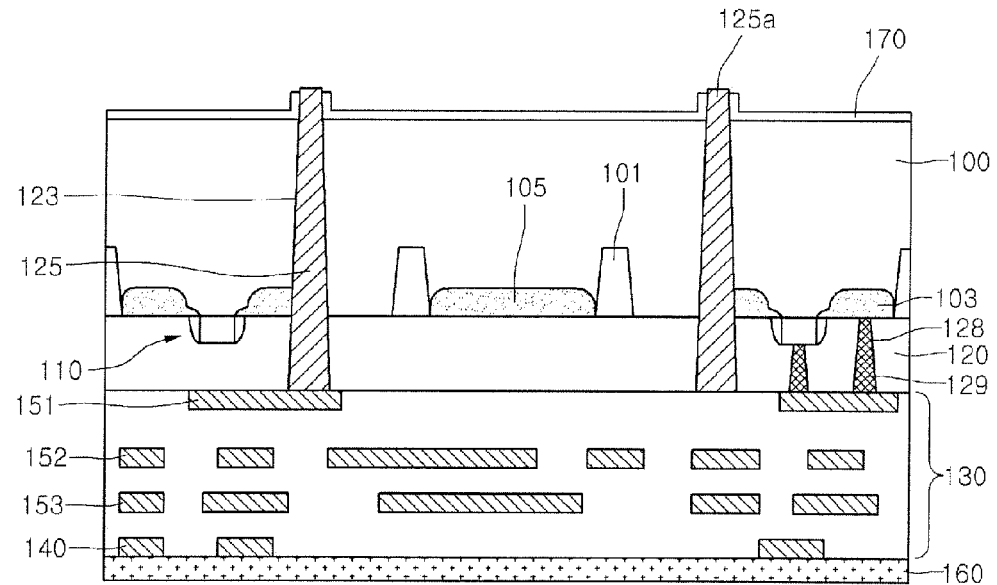

As shown in FIG. 7, an etch back process is performed with the photoresist 175 protecting the liner oxide layer 170 on the regions corresponding to the photodiode 105. Accordingly, the exposed portion of the liner oxide layer 170 is removed to expose the projection part 125a.

Thereafter, the photoresist 175 is removed through an ashing process. Accordingly, the projection part 125a of the connection via metal 125 protrudes from the backside of the semiconductor substrate 100, and the liner oxide layer 170 is formed on the entire surface of the backside except for a top of the projection part 125a.

The liner oxide layer 170 may be formed at a portion of the projection part 125a protruding from the backside of the semiconductor substrate 100.

The liner oxide layer 170 partially surrounds a lateral side of the projection part 125a. The liner oxide layer 170 can cover an upper lateral portion of the projection part 125a.

Figure 8:
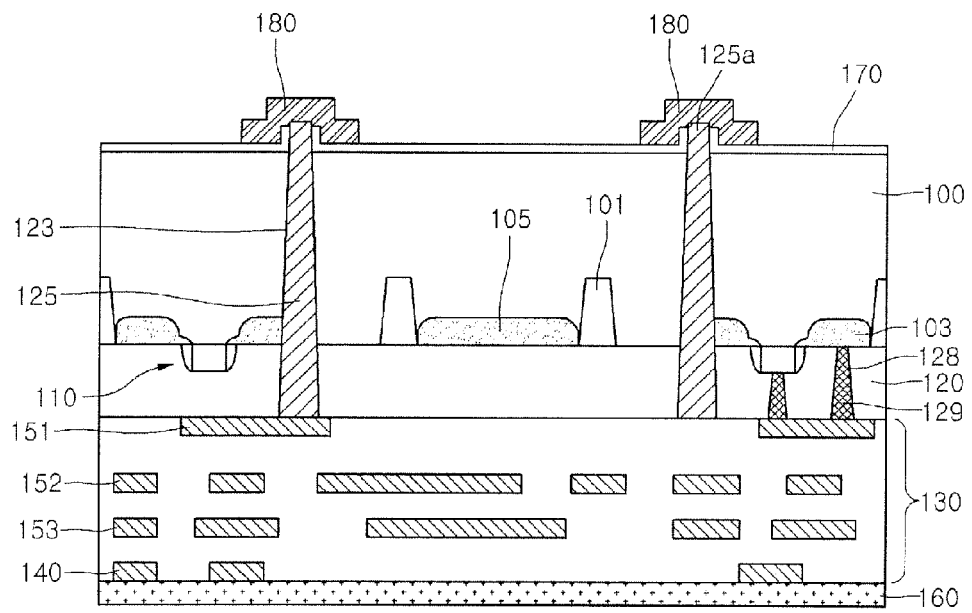

As shown in FIG. 8, a metal pad 180 is formed to cover the projection part 125a.

The metal pad 180 may include one selected from the metal group consisting of Al, Co, W, Ti, Ta, and Cu.

The metal pad 180 may be formed by pattering a metal layer through a photolithography process after the metal layer has been deposited on the entire backside of the semiconductor substrate 100.

Figure 9:
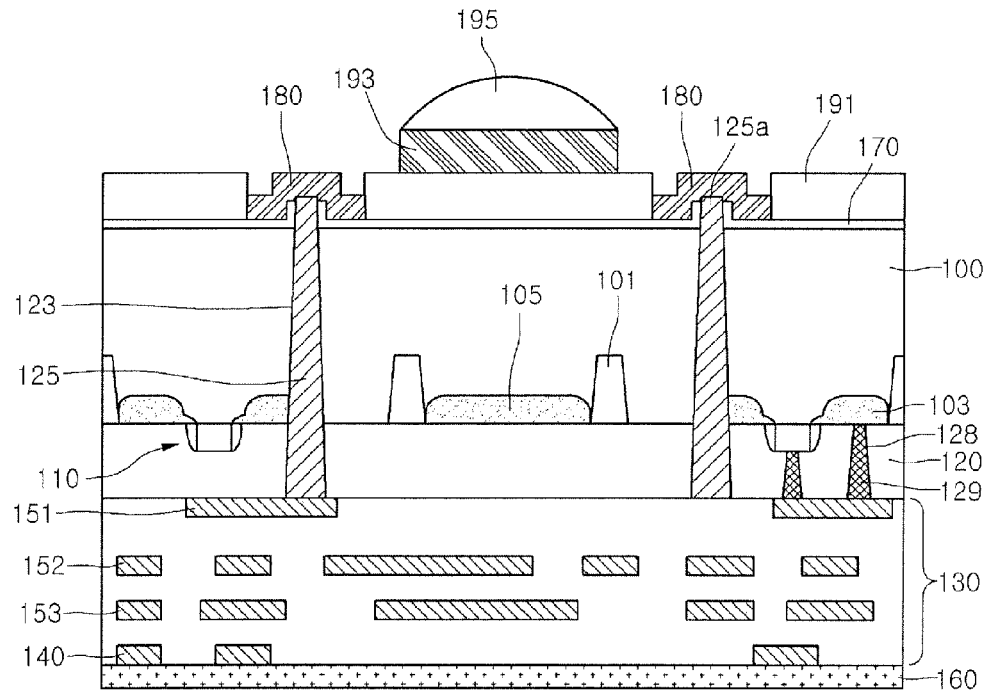

Thereafter, as shown in FIG. 9, a protective layer 191 is formed on the backside of the semiconductor substrate 100 and selectively etched to open (expose) the metal pad 180.

The protective layer 191 can include at least one of an oxide layer and a nitride layer.

A color filter 193 can be formed on the protective layer 191 corresponding to the photodiode area 105, and a micro-lens 195 can be formed on the color filter 193.

The color filter 193 can include a red color filter, a green color filter, and a blue color filter.

The image sensor according to an embodiment allows light to be incident onto the photodiode area 105 after receiving the light through the backside of the semiconductor substrate 100, thereby shortening an optical path to reduce light loss and improve image sensitivity.

According to the image sensor of an embodiment, the metal pad 180 is formed on the backside of the semiconductor substrate 100 such that the metal pad 180 is insulated from the semiconductor substrate 100 while making contact with the connection via metal 125 in the super via (connection via 123). Since the metal pad 180 having superior quality can be formed on a common wafer instead of a high-price silicon on insulator (SOI) wafer in order to insulate the semiconductor substrate 100 from the metal pad 180, the manufacturing cost can be reduced.

FIGS. 10 to 13 are cross-sectional views showing the manufacturing process of an image sensor according to another embodiment.

Figure 10:
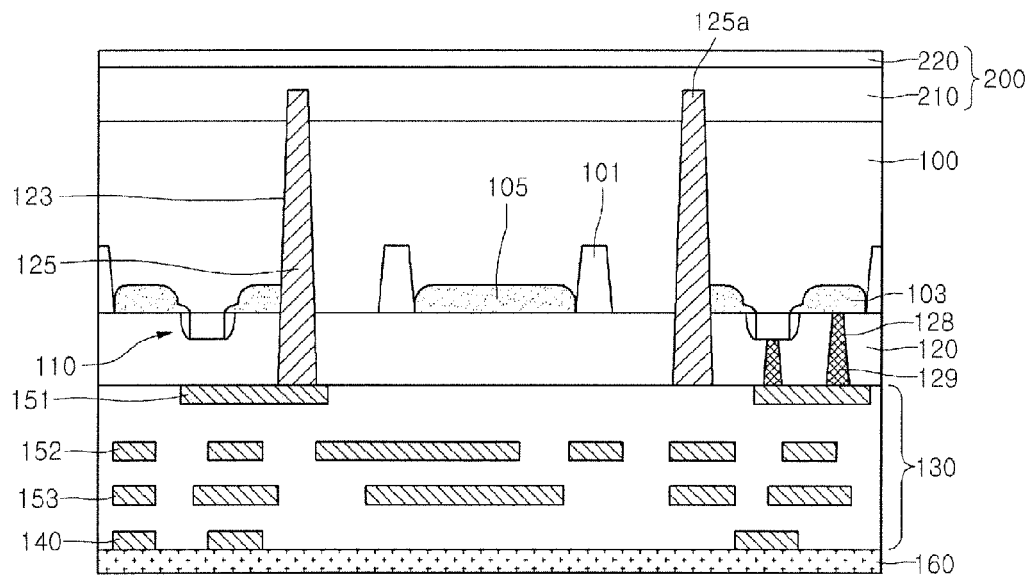
FIGS. 10 to 13 are cross-sectional views showing a method for manufacturing an image sensor according to another embodiment.

The manufacturing process of the image sensor according to the embodiment shown beginning at FIG. 10 can employ the processes of FIGS. 1 to 4.

As shown in FIG. 10, an oxide layer 210 is formed on the entire surface of the semiconductor substrate 100 having the projection part 125a, and a nitride layer 220 is formed on the oxide layer 210, thereby forming a protective layer 200 including the oxide layer 210 and the nitride layer 220.

Since the oxide layer 210 covers the projection part 125a, the oxide layer 210 may have a thickness thicker than the protrusion height of the projection part 125a.

Figure 11:
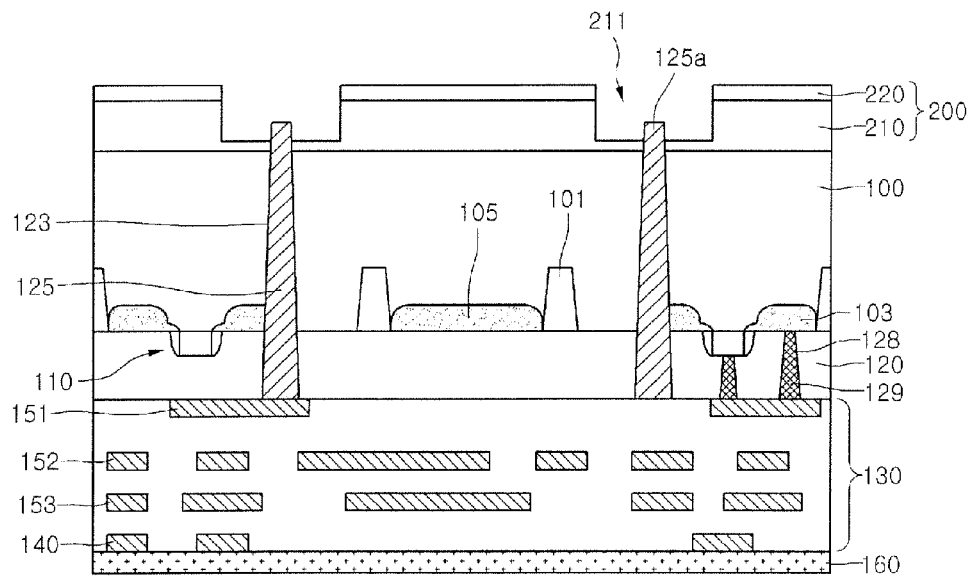

As shown in FIG. 11, the protective layer 200 in a region corresponding to the projection part 125a is etched, thereby forming a trench 211 to expose the projection part 125a. In this case, the oxide layer 210 remains by a predetermined thickness from the backside of the semiconductor substrate 100 so that the trench 211 does not expose the semiconductor substrate 100.

Accordingly, the projection part 125a protrudes from an internal bottom surface of the trench 211.

Figure 12:
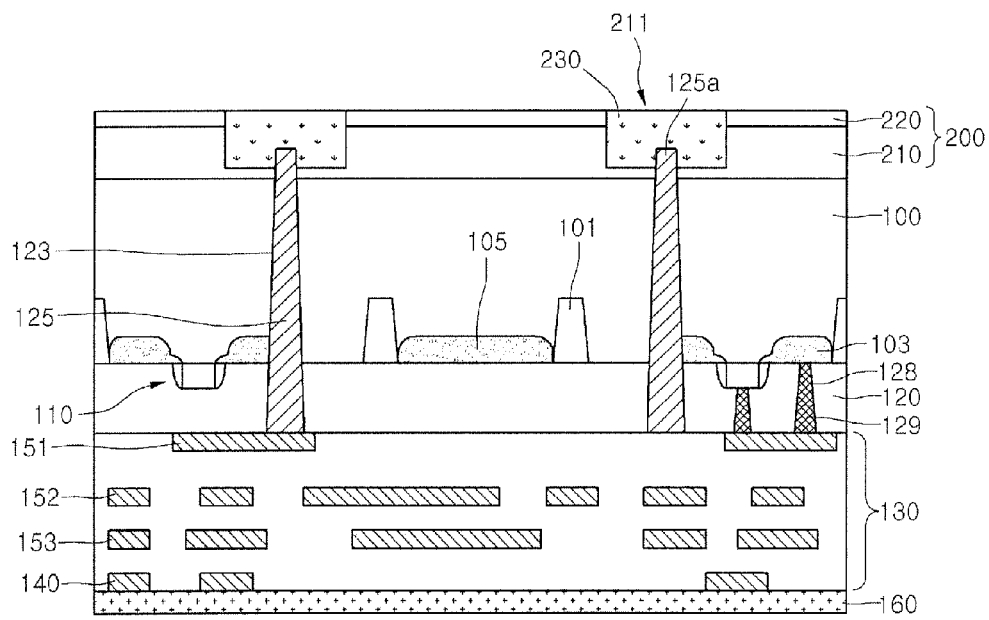

As shown in FIG. 12, after forming a metal layer on the protective layer 200 having the trench 211, the metal layer is ground (using, for example, chemical mechanical processing) until the nitride layer 220 of the protective layer 200 is exposed, thereby forming a metal pad 230 filled in the trench 211.

In one embodiment, the metal layer may be formed by plating Cu on the protective layer 200 through an electroplating technique. The metal layer may be formed by depositing other metal on the protective layer 200 in addition to, or in place of, Cu.

The metal pad 230 may include one selected from the metal group consisting of Al, Co, W, Ti Ta, and Cu.

Thus, the process of forming the protective layer 200 and a pad opening process can be simultaneously performed while forming the metal pad 230.

Figure 13:
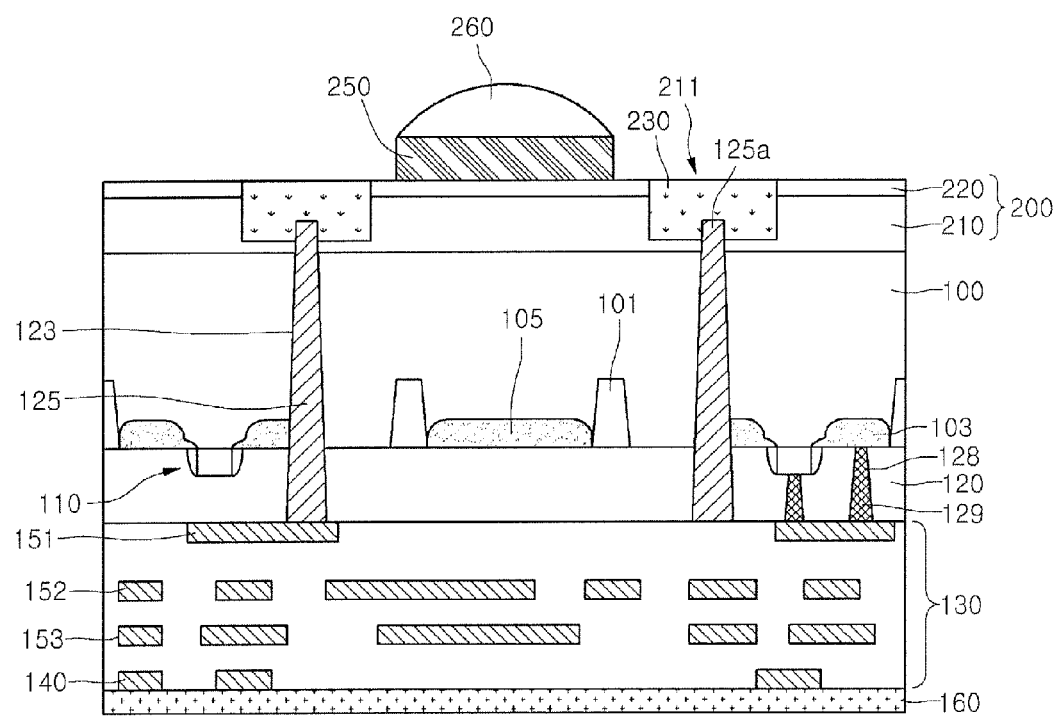

As shown in FIG. 13, a color filter 250 can be formed on the protective layer 200 in a region corresponding to a pixel area, and a micro-lens 260 may be formed on the color filter 250.

The color filter 250 can include a red color filter, a green color filter, and a blue color filter.

The image sensor according to an embodiment allows light to be incident onto the photodiode area 105 after receiving the light through the backside of the semiconductor substrate 100, thereby shortening an optical path to reduce light loss and improve image sensitivity.

According to the image sensor of an embodiment, the metal pad 230 is formed on the backside of the semiconductor substrate 100 such that the metal pad 230 is insulated from the semiconductor substrate 100 while making contact with a super via (via connection metal 125). Since the metal pad 230 having superior quality can be formed by using a common wafer instead of high-price silicon on insulator (SOI) in order to insulate the semiconductor substrate 100 from the metal pad 230, the manufacturing cost can be reduced.

According to the image sensor of an embodiment, the metal pad 230 can be formed on the backside of the semiconductor substrate 100 through a damascene process, thereby forming the protective layer 200 while forming the metal pad 230. Accordingly, the manufacturing process can be simplified and easily performed.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. An image sensor comprising:
   a semiconductor substrate formed on a first surface thereof with a readout circuitry and a photodiode area;
   a metal interconnection layer formed on the first surface;
   a connection via metal extending from the first surface to a second surface of the semiconductor substrate, the connection via metal having a projection part projecting from the second surface;
   an insulating layer formed on the second surface of the semiconductor substrate to expose the projection part while surrounding a portion of a lateral side of the projection part; and
   a metal pad formed on the insulating layer such that the metal pad covers the projection part,
   wherein the insulating layer has a thickness thinner than a projection height of the projection part.

2. The image sensor of claim 1, wherein the insulating layer comprises a TEOS layer.

3. The image sensor of claim 1, wherein the insulating layer is formed on a portion of the projection part extending from the second surface.

4. The image sensor of claim 1, further comprising:
   a protective layer formed over the insulating layer; and
   a micro-lens formed on the protective layer in a region corresponding to the photodiode area.

5. An image sensor comprising:
   a semiconductor substrate formed on a first surface thereof with a readout circuitry and a photodiode area;
   a metal interconnection layer formed on the first surface;
   a connection via metal extending from the first surface to a second surface of the semiconductor substrate, the connection via metal having a projection part projecting from the second surface;
   a protective layer formed on the second surface, wherein the protective layer has a trench exposing the projection part; and
   a metal pad formed in the trench so that the metal pad is electrically connected to the projection part, while being insulated from the semiconductor substrate,
   wherein the protective layer comprises an oxide layer formed on the second surface and a nitride layer formed on the oxide layer,
   wherein the oxide layer has a thickness thicker than a projection height of the projection part.

6. The image sensor of claim 5, further comprising a micro-lens formed on the protective layer in a region corresponding to the photodiode area.

7. The image sensor of claim 5, wherein a portion of the protective layer is interposed between the metal pad and the semiconductor substrate.

* * * * *